United States Patent
Withers

(10) Patent No.: US 8,564,294 B2
(45) Date of Patent: Oct. 22, 2013

(54) NUCLEAR MAGNETIC RESONANCE PROBE COMPRISING SLIT SUPERCONDUCTING COIL WITH NORMAL-METAL OVERLAYER

(75) Inventor: Richard S. Withers, Sunnyvale, CA (US)

(73) Assignee: Agilent Technologies, Inc., Santa Clara, CA (US)

(*) Notice: Subject to any disclaimer, the term of this patent is extended or adjusted under 35 U.S.C. 154(b) by 221 days.

(21) Appl. No.: 13/170,610

(22) Filed: Jun. 28, 2011

(65) Prior Publication Data

US 2013/0002251 A1    Jan. 3, 2013

(51) Int. Cl.
    *G01V 3/00*      (2006.01)
(52) U.S. Cl.
    USPC ............................................. 324/318; 324/322
(58) Field of Classification Search
    USPC ................................ 324/318, 322, 320, 300
    See application file for complete search history.

(56) References Cited

U.S. PATENT DOCUMENTS

| | | | |
|---|---|---|---|
| 5,565,778 A | 10/1996 | Brey et al. | |
| 6,026,311 A * | 2/2000 | Willemsen Cortes et al. | 505/210 |
| 6,121,776 A | 9/2000 | Marek | |
| 6,169,399 B1 * | 1/2001 | Zhang et al. | 324/318 |
| 6,590,394 B2 * | 7/2003 | Wong et al. | 324/318 |
| 7,295,085 B2 * | 11/2007 | Face | 333/99 S |
| 7,564,244 B2 * | 7/2009 | Freytag | 324/318 |
| 7,701,217 B2 | 4/2010 | Withers et al. | |
| 2006/0017440 A1 | 1/2006 | Freytag | |

FOREIGN PATENT DOCUMENTS

| | | |
|---|---|---|
| DE | 102004035851 A1 | 3/2006 |
| EP | 2151695 A2 | 2/2010 |

OTHER PUBLICATIONS

GB Search Report dated Sep. 3, 2012 for Application No. GB1209957.8.
Office Action dated Jul. 3, 2013 in German Patent Application No. 102012210815.7.

* cited by examiner

*Primary Examiner* — Louis Arana

(57) ABSTRACT

A nuclear magnetic resonance (NMR) probe comprises a superconducting material formed in a spiral having a plurality of fingerlets separated by a plurality of slits, and a normal-metal overlayer formed on the spiral over the plurality of fingerlets and the plurality of slits.

20 Claims, 21 Drawing Sheets

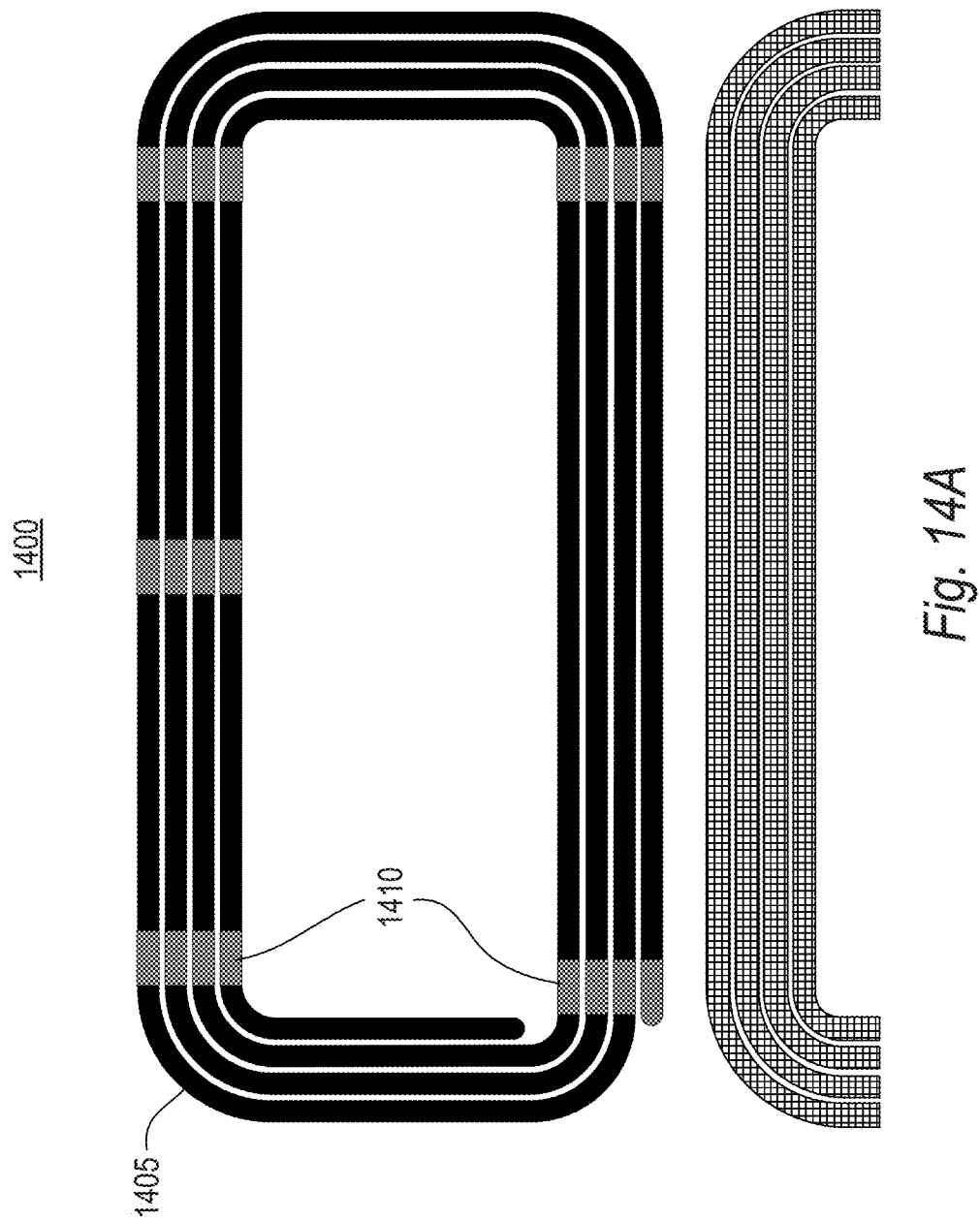

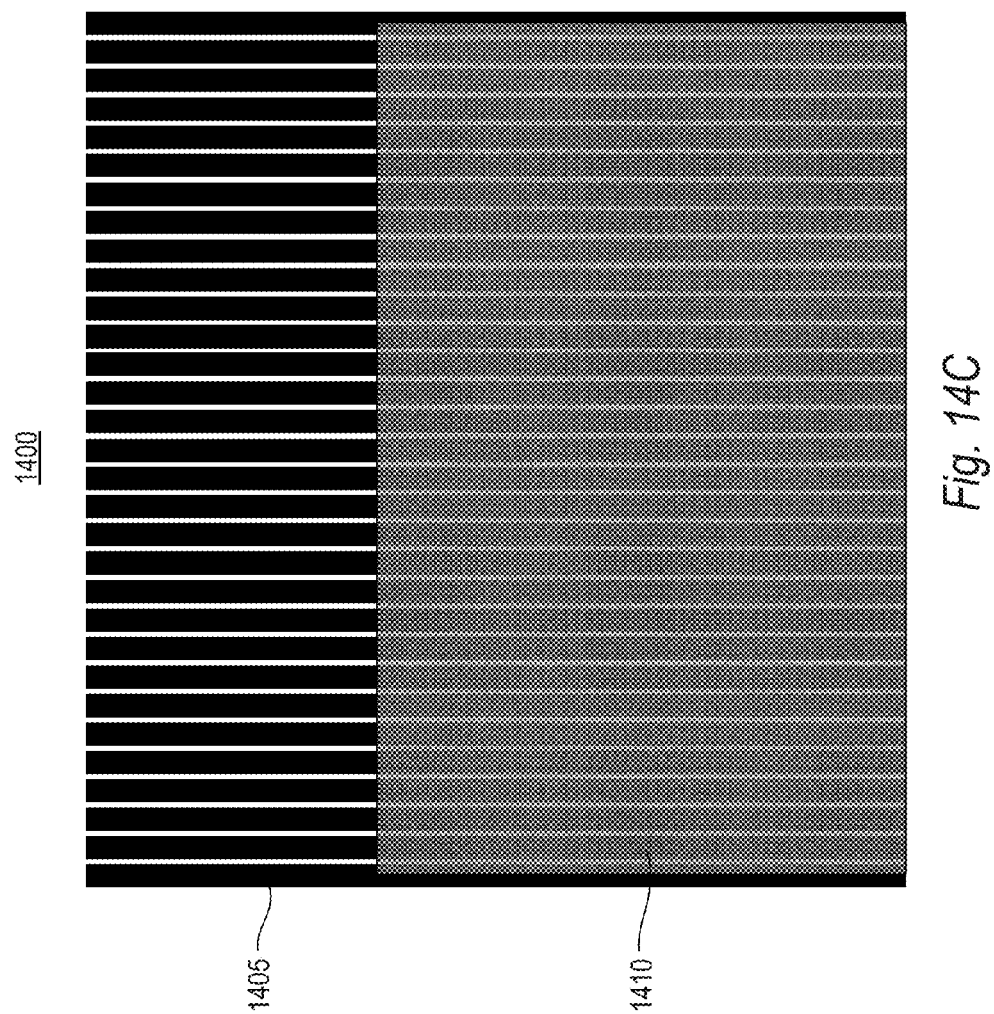

NUCLEAR MAGNETIC RESONANCE PROBE COMPRISING SLIT SUPERCONDUCTING COIL WITH NORMAL-METAL OVERLAYER

BACKGROUND

Nuclear magnetic resonance (NMR) technologies, such as NMR spectrometers and imaging systems, allow researchers to observe certain magnetic properties of atomic nuclei. These observations can be used to study basic chemical and physical properties of molecules or other small objects. NMR technologies are commonly used, for instance, to perform research on organic and inorganic molecules in the fields of medicine, chemistry, biology, and pharmacology.

NMR measurements are typically performed by an NMR probe that receives a sample to be studied. The sample is placed in a static magnetic field which aligns the magnetic dipoles of its atomic nuclei. Thereafter, the NMR probe applies a time-varying radio-frequency (RF) magnetic field to the sample to perturb the alignment of the magnetic dipoles. Next, the NMR probe detects the magnetic field generated by the perturbed nuclei as they return to their aligned positions. Finally, the detected magnetic field is analyzed to identify various aspects of the sample, such as its composition, the structure of its molecules, and other valuable information.

The NMR probe typically comprises a probe coil that generates the time-varying magnetic field to be applied to the sample and/or detects the magnetic field generated by the perturbed atomic nuclei as they return to their aligned positions. These magnetic fields typically oscillate in the radio-frequency (RF) range. Accordingly, the probe coil may be referred to as an RF transmitter coil, an RF receiver coil, or an RF transmitter/receiver coil.

To properly perturb the atomic nuclei, the probe coil should generate the time-varying magnetic field at the resonance frequency of the atomic nuclei. In addition, to accurately detect the magnetic field generated by the atomic nuclei, the probe coil should be tuned to detect magnetic oscillations at the resonance frequency of the atomic nuclei.

The performance of the probe coil can be evaluated according to its quality value (Q-value), which indicates its bandwidth relative to a resonant frequency of interest. Q is inversely proportional to the resistance of the coil. Thus, a high-Q coil has lower thermal noise and so, if tuned to the frequency of the sample's nuclei, can detect their magnetic oscillations with high sensitivity. Accordingly, other things being equal, a probe coil with a higher Q-value can produce higher-sensitivity measurements than a probe coil with a lower Q-value.

One way to improve the Q-value of an NMR probe coil is by forming it with a superconducting material. The superconducting material can enhance the sensitivity of the coil by responding to relatively small magnetic fields of the sample. Unfortunately, however, the superconducting material can also create unwanted magnetic fields on the sample due to persistent direct currents that flow through it. These unwanted magnetic fields can degrade the homogeneity of the static magnetic field applied to the sample, which can prevent the NMR probe from obtaining well-resolved and high-sensitivity measurements.

SUMMARY

In accordance with a representative embodiment, a nuclear magnetic resonance (NMR) probe coil comprises: a superconducting material formed in a spiral having a plurality of fingerlets separated by a plurality of slits; and a normal-metal overlayer formed on the spiral over the plurality of fingerlets and the plurality of slits.

In accordance with another representative embodiment, a nuclear magnetic resonance (NMR) probe, comprises: a probe coil comprising a superconducting material formed in a spiral having a plurality of fingerlets separated by a plurality of slits, and a normal-metal overlayer formed on the spiral over the plurality of fingerlets and the plurality of slits; and a heat exchanger configured to cryogenically cool the superconducting material.

In accordance with another representative embodiment, a method of forming a nuclear magnetic resonance (NMR) probe coil comprises: forming a high temperature superconducting (HTS) film on substrate; forming the HTS film into a spiral comprising a plurality of fingerlets separated by a plurality of slits; and forming a normal-metal overlayer over the plurality of fingerlets and the plurality of slits.

BRIEF DESCRIPTION OF THE DRAWINGS

The described embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 14A through 14D illustrate an NMR probe coil in accordance with another representative embodiment.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

The representative embodiments relate generally to NMR measurement technologies such as NMR spectrometers and imaging systems. Certain embodiments provide an NMR probe comprising an NMR probe coil formed of a superconducting material. The NMR probe coil is slit along its length to reduce persistent direct currents, which can disturb the static magnetic field applied to an NMR sample. The slit coil is also covered with an unslit normal-metal overlayer to remove spurious resonant modes created by the slitting and to prevent arcing between adjacent slit elements. The removal of spurious resonance modes and arcing can improve the probe's ability to obtain sensitive measurements.

Figure 1:
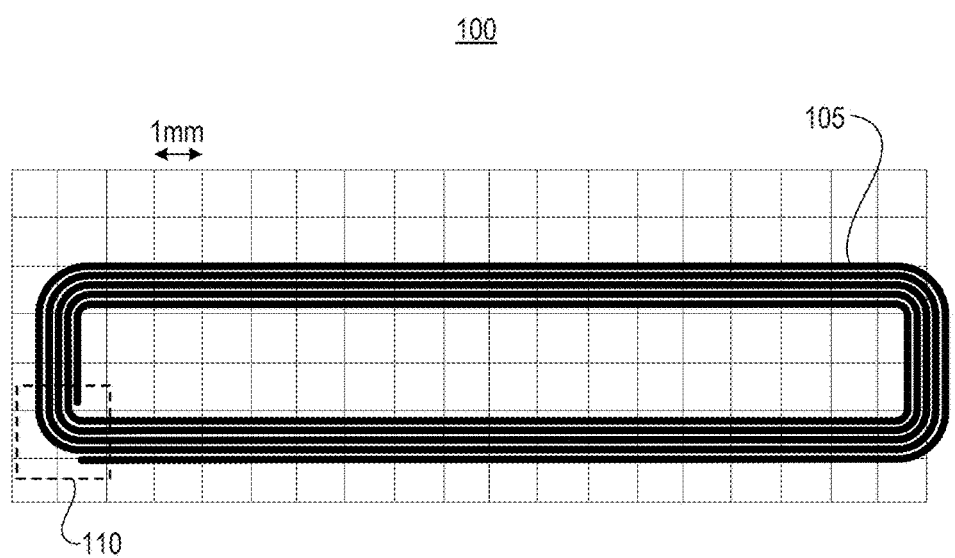
FIG. 1 is a schematic diagram of an NMR probe coil in accordance with a representative embodiment.

FIG. 1 is a schematic diagram of an NMR probe coil 100 in accordance with a representative embodiment. A grid is provided in FIG. 1 to illustrate the scale of NMR probe coil 100, with each square in the grid corresponding to 1 mm.

NMR probe coil 100 is positioned in an NMR probe, and it performs transmission and/or reception of electromagnetic signals with respect to a sample in the probe. In other words, it can provide an RF magnetic field to a sample to stimulate its atomic nuclei, and/or receive a corresponding response from the atomic nuclei.

NMR probe coil 100 is formed in a spiral 105 in order to generate a magnetic field on the sample. Spiral 105 comprises a thin film of high temperature superconducting (HTS) material formed on a dielectric substrate, a plurality of slits formed along the length of the HTS material, and a normal-metal overlayer formed over the HTS material, patterned in the same way as the HTS material. The purpose of this first normal-metal layer is to prevent burn-out of the HTS film under high-power circumstances by what is called an "RF quench." This normal-metal layer is distinct from the unslit normal-metal layer that is the subject of this application. In the remainder of this application, we will not in every case explicitly mention this first normal-metal layer, but it typically forms part of the HTS layer.

The HTS material can comprise, for instance, yttrium barium copper oxide (YBCO) or various other rare earth barium copper oxides (ReBCO). It is typically formed on a dielectric substrate, such as synthetic sapphire, through an epitaxial growth process. In the epitaxial growth process, the HTS material is deposited on the substrate by sputtering, evaporation, or one of various other deposition techniques. In some examples, the substrate is about 400 micrometers thick and the HTS material is about 0.3 micrometers thick. After the HTS material is deposited on the substrate, a flash of normal-metal such as gold can be placed over the HTS material to protect it against burn-out during application of high RF power and to prevent its degradation by environmental contaminants.

Figure 2:
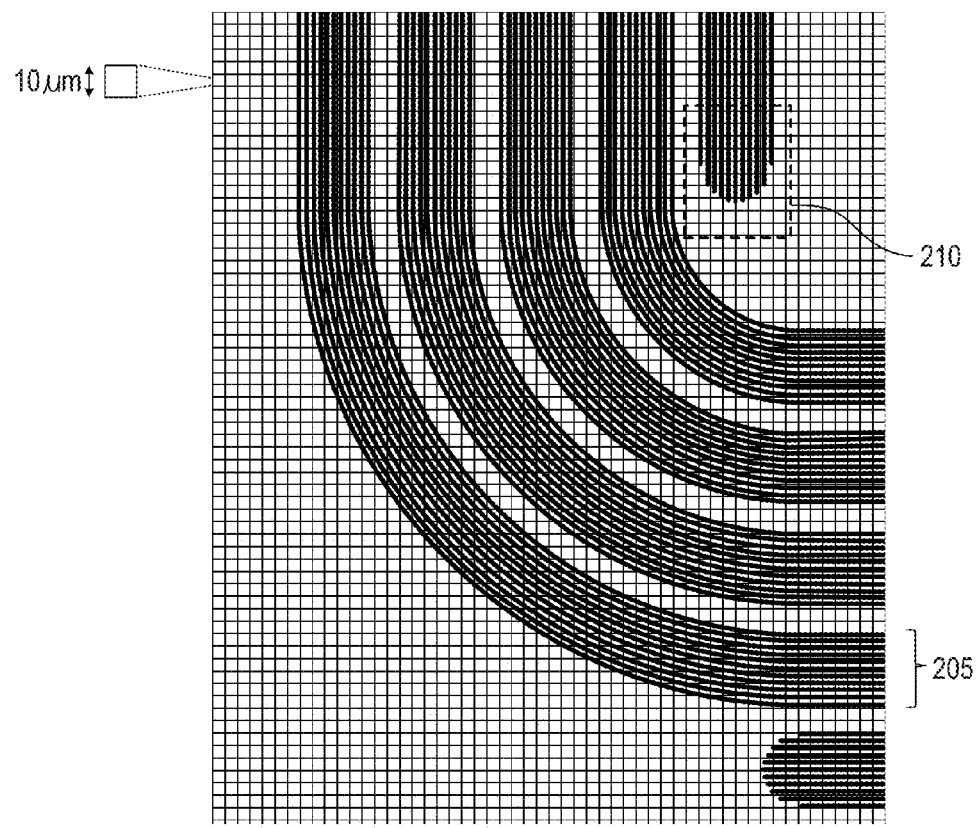
FIG. 2 is a schematic diagram illustrating a portion of the NMR probe coil of FIG. 1 in accordance with a representative embodiment.

The HTS material and its first normal-metal coating are etched to form the slits (which we call "gaplets" to distinguish them from the larger "gaps" between turns of a spiral or between fingers of an interdigital capacitor) along their length. This can be accomplished, for instance, using photolithography. The slits divide the HTS material into a number of parallel channels, or fingerlets. These fingerlets are not visible in FIG. 1, so FIG. 2 shows an enlarged view of a portion 110 of NMR probe coil 100.

The HTS material can later be further modified to fine tune the fundamental resonance mode of spiral 105. This can be accomplished, for instance by performing laser trimming until it has its fundamental resonant mode at the desired frequency.

A second normal-metal overlayer is formed on the HTS material over the fingerlets. The normal-metal overlayer covers both the fingerlets and the slits between them. It is typically formed by depositing metal on the substrate over the HTS material, and then patterning the deposited metal in the shape of spiral 105. This pattern is different from the pattern of the HTS layer. The normal-metal overlayer can comprise, for instance, gold, silver, or another relatively non-reactive and highly conductive layer, or a combination of metals such as a thin layer of titanium with a thicker layer of gold on top of it. It is known to those skilled in the art that gold adheres poorly to oxides such as sapphire, so that titanium is often used to promote adhesion.

NMR probe coil 100 is typically used in a cryogenic probe in conjunction with a temperature control mechanism. For example, in some embodiments, two NMR probe coils 100 are placed on opposite sides of a sample tube, and a substrate supporting each coil is attached to a heat exchanger. The heat exchanger provides cooling and temperature control of each NMR probe coil 100. During operation, the NMR probe coils 100 are typically cooled to a temperature of about 20K or lower. This cooling tends to minimize electrical noise ("Johnson" or "thermal" noise) in the HTS material, and it can substantially increase its amplitude and power sensitivity.

The windings of spiral 105 can be inductively coupled to a coupling loop that is electrically connected to an NMR spectrometer. The coupling loop can provide RF energy to NMR probe coil 100 to excite NMR resonance and it can receive a response induced in NMR probe coil 100 from the sample and transmit the response to the spectrometer for processing, recording, and display.

In some embodiments, spiral 105 is arranged in a back-to-back configuration with another spiral wound in the opposite direction. In other words, spiral 105 can be one of two counterwound spirals. Various examples of counterwound spirals are described in commonly owned U.S. Pat. No. 7,701,217, by Withers et al., the disclosure of which is hereby incorporated by reference in its entirety. In one example embodiment, the counterwound spirals are configured to resonate at around 150 MHz to detect $^{13}$C in a 14.1-T magnet. A probe with these spirals can be designed to accept samples in 1.5-mm outer-diameter tubes, for example.

FIG. 2 illustrates the portion 110 of NMR probe coil 100 shown in FIG. 1 in accordance with a representative embodiment. Portion 110 is shown without the normal-metal overlayer so that fingerlets are visible in each turn of spiral 105. A grid is provided to illustrate the scale of the fingerlets, with each square in the grid corresponding to 10 µm.

Referring to FIG. 2, each turn of spiral 105 comprises eleven fingerlets 205 of the HTS material. In a typical configuration, the turns of spiral 105 are separated from each other by about 30 to 100 µm, and fingerlets 205 are separated from each other by about 3 µm. Fingerlets 205 typically have widths of about 10 µm.

Slits are formed between fingerlets 205 for electrical separation. This electrical separation reduces the strength of magnetic fields generated by persistent current loops in the HTS material. The reduction of these magnetic fields prevents distortion of magnetic field homogeneity in a sample region near NMR probe coil 100. In some applications, an adequate reduction can be achieved by limiting the width of each fingerlet 205 to about 10 µm or less.

The addition of slits to the HTS material has a relatively minor impact on the fundamental resonance mode of NMR probe coil 100, but it tends to multiply spurious resonance modes. However, the addition of the normal-metal overlayer suppresses most of the spurious resonance modes by shorting them out.

Figure 3:
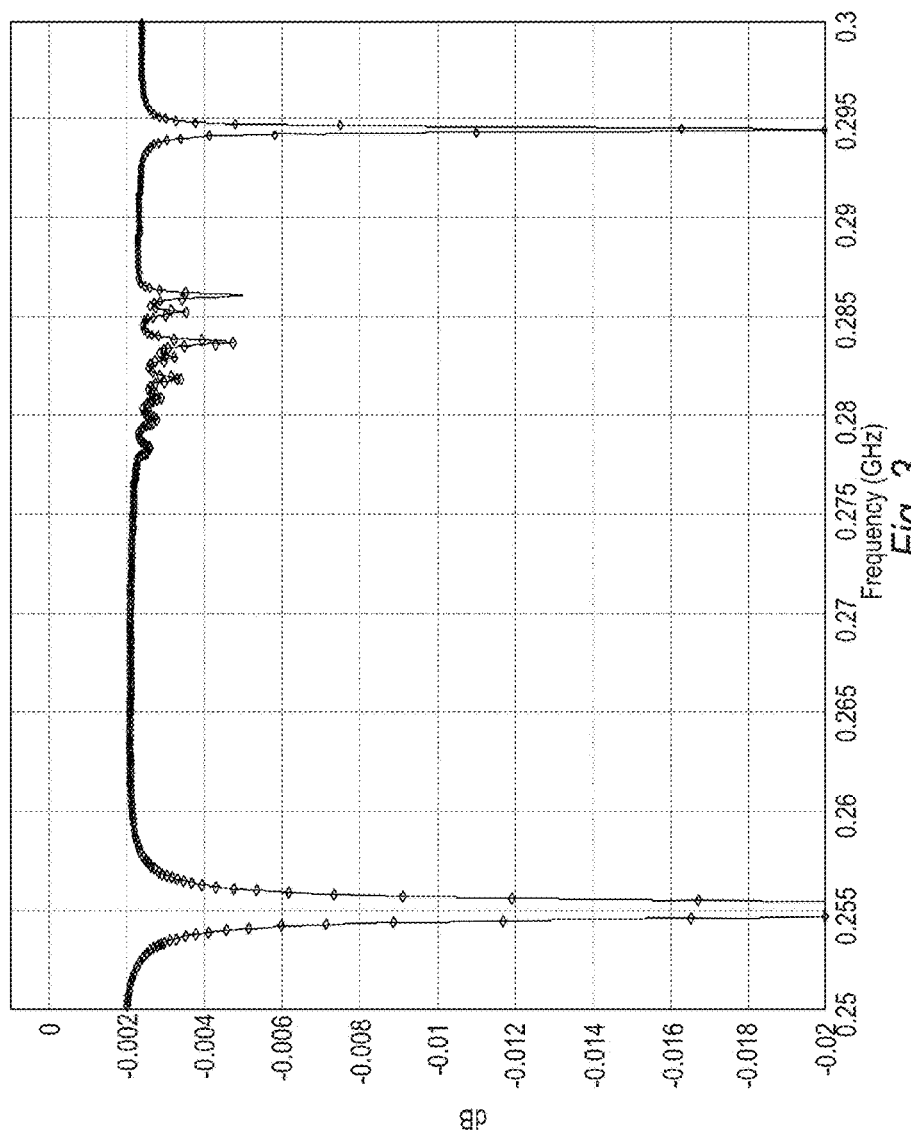
FIG. 3 is a graph illustrating a group of spurious resonance modes that can be created by slits in an NMR probe coil.
Figure 4:
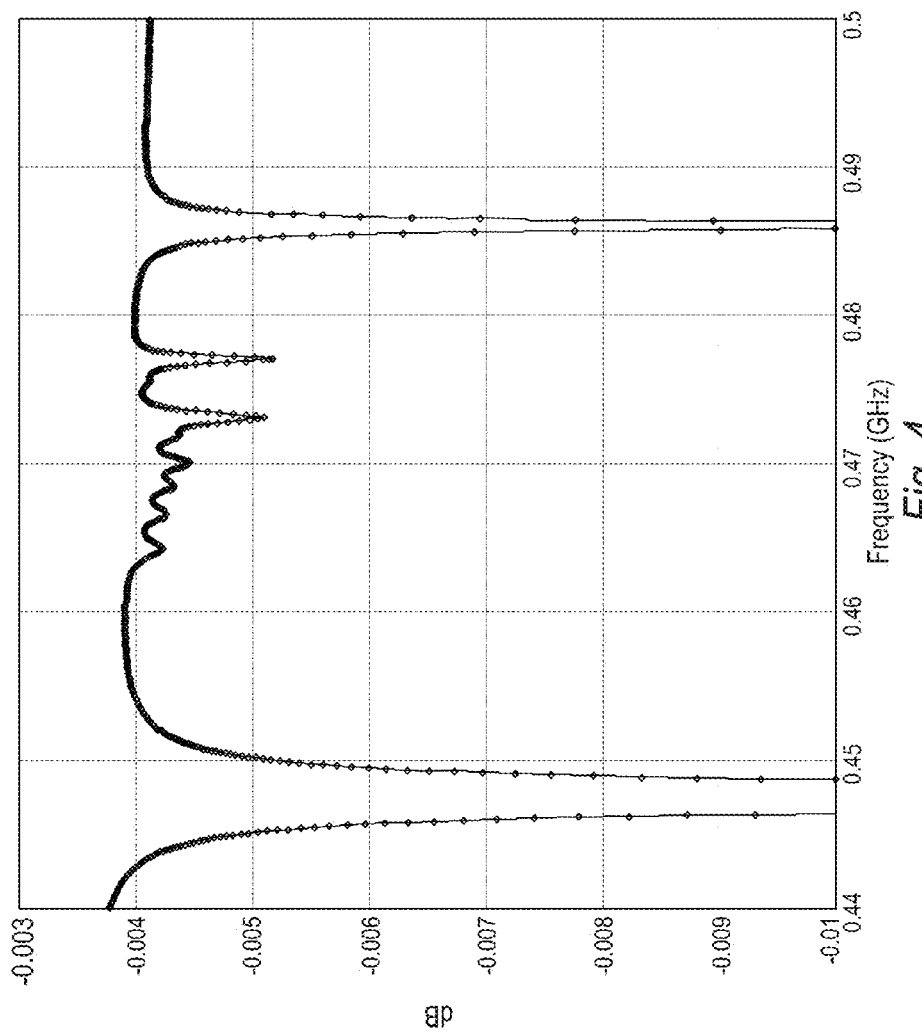
FIG. 4 is a graph illustrating another group of spurious resonance modes that can be created by slits in an NMR probe coil.

FIGS. 3 and 4 illustrate examples of spurious resonance modes that can be generated by slits in an NMR probe coil comprising an HTS material without the normal-metal overlayer. More specifically, FIG. 3 is an S11 plot illustrating a group of spurious resonance modes corresponding to a higher-order mode of an unslit coil, and FIG. 4 is an S11 plot illustrating a group of spurious resonance modes corresponding to another higher-order mode of the unslit coil.

The NMR probe coil of FIGS. 3 and 4 is a spiral coil made for the detection of deuterium in an 11.7-tesla magnet. Without slits, the coil has a fundamental resonance mode, as predicted by an electromagnetic simulation program, at 69 MHz and higher-order modes at 168, 256, 353, and 449 MHz. The coil can be tuned to a target frequency of 76.7 MHz by laser trimming. The mode spacing of about 92 MHz is a frequency at which an additional half wavelength will fit within an unfolded length of the spiral.

The NMR probe coil of FIGS. 3 and 4 is divided into ten fingerlets using nine slits. After this division, the coil has a fundamental resonance mode at a frequency of 68 MHz, a second mode at 167.35 MHz, a third mode at 255 MHz, a fourth mode near 350 MHz, and a fifth mode near 450 MHz. In addition, each of the higher-order modes becomes a group of ten higher-order modes in the split coil. For instance, in the split coil, the second mode is accompanied by eight modes between 185 and 191 MHz, and a ninth mode at 197 MHz. In other words, the second mode becomes a group of ten modes according to the number of fingerlets in the split coil.

The groups of higher modes tend to distort NMR measurements, so it is desirable to eliminate as many of them as possible. These higher modes can be particularly troublesome if they fall near a frequency of a higher-frequency nucleus, such as proton, because they can prevent the nucleus from being detected with high sensitivity.

In the example of FIG. 3, the third mode of the unslit coil becomes a group with nine additional modes between 277 and 294 MHz in the split coil. In the example of FIG. 4, the fifth mode of the unslit coil near 450 MHz becomes a group with nine additional modes between 464 and 487 MHz. These modes can degrade certain measurements because they fall close to the proton resonance at 500 MHz.

One way to address spurious modes that fall near frequencies of interest is to laser trim the probe coil to avoid those modes. This trimming, however, can be expensive and time consuming. It is also unreliable and irreversible. Another way of addressing spurious modes near frequencies of interest is to discard coils that have such modes and replace them with other coils with modes further away. This also drives up the expense and time of producing coils. Yet another way to avoid these spurious modes is by adding the normal-metal overlayer to the coil. The normal-metal overlayer eliminates the spurious modes that arise from the slits in the HTS material, and it does so with superior reliability and lower cost than the other methods.

In addition to the problem of spurious modes, the slits in the HTS material can also create an electrical arcing problem. This arcing can be a major source of failure in certain types of NMR probes, such as high power probes designed for carbon observation. In such probes, a large potential difference can exist between adjacent fingerlets, causing an arc to form between them. As an example, arcing can occur at the ends of fingerlets 205 due to intensified electrical fields resulting from the geometry of the ends.

Figure 5:
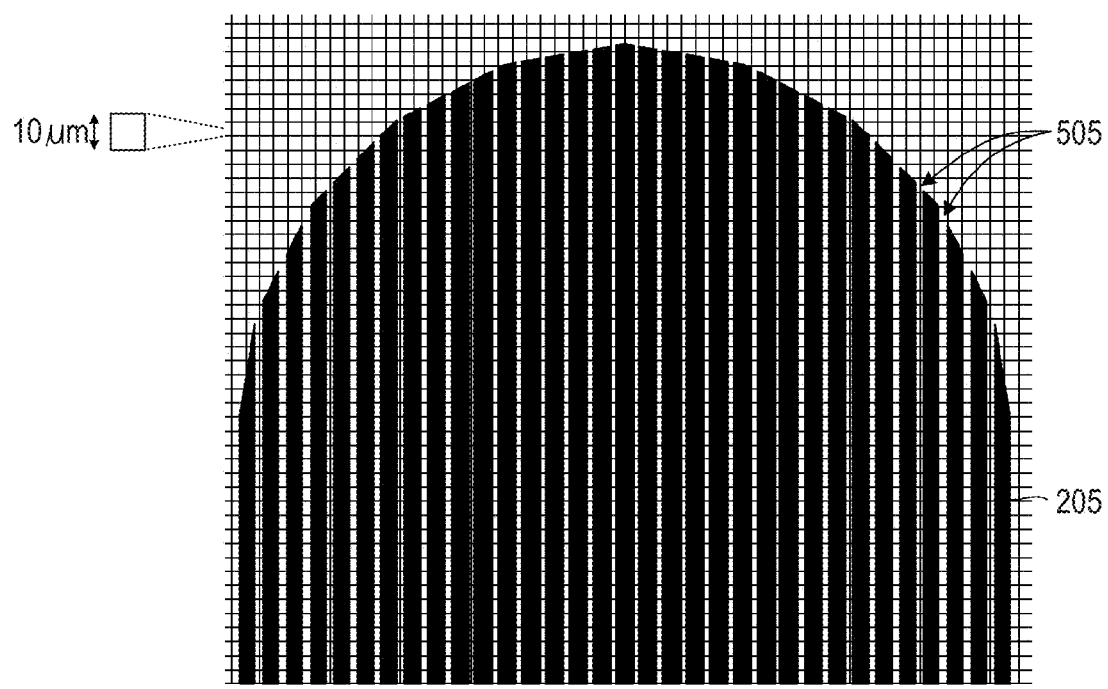
FIG. 5 is a schematic diagram illustrating a portion of the NMR probe coil of FIG. 1 in accordance with a representative embodiment.
Figure 6:
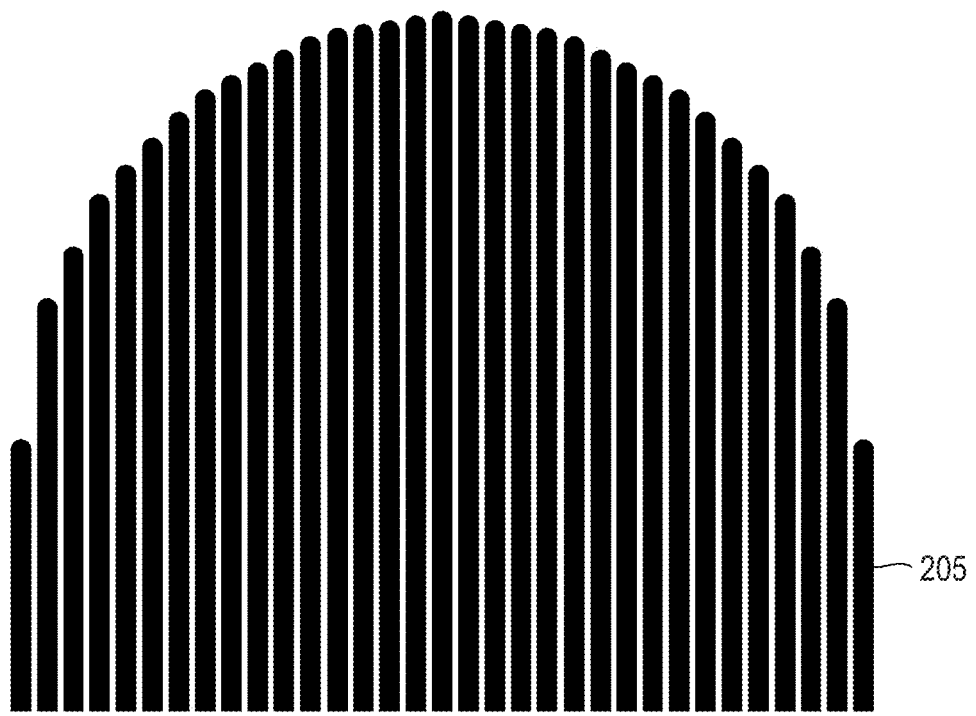
FIG. 6 is a schematic diagram illustrating a portion of the NMR probe coil of FIG. 1 in accordance with a representative embodiment.

FIGS. 5 and 6 illustrate examples of different end configurations for fingerlets 205 of NMR probe coil 100. These examples are taken at a portion 210 shown in FIG. 2, and a grid is provided to show the scale of fingerlets 205. In the grid, each square corresponds to 10 µm.

Referring to FIG. 5, the ends of spiral 105 are rounded into a semicircle shape, and the ends of fingerlets 205 have sharp corners 505. These corners can create a relatively high electrical field between fingerlets 205 having different electrical potentials. This can result in arcing between adjacent fingerlets 205.

Referring to FIG. 6, arcing is suppressed by forming the ends of fingerlets 205 with semicircular shapes, which tends to reduce the peak electrical field generated between adjacent fingerlets 205. In addition, the arcing is further suppressed by increasing the distance between adjacent fingerlets 205 e.g., from 2.5 to 3 µm.

Although arcing can be reduced by reshaping the ends of fingerlets 205, arcing can also occur along the lengths of fingerlets 205, and between two spirals in a counterwound pair. These forms of arcing are not readily suppressed by merely reshaping spiral 105. However, the normal-metal overlayer formed over the HTS material can substantially eliminate arcing between adjacent fingerlets by equalizing their electrical potentials.

Figure 7:
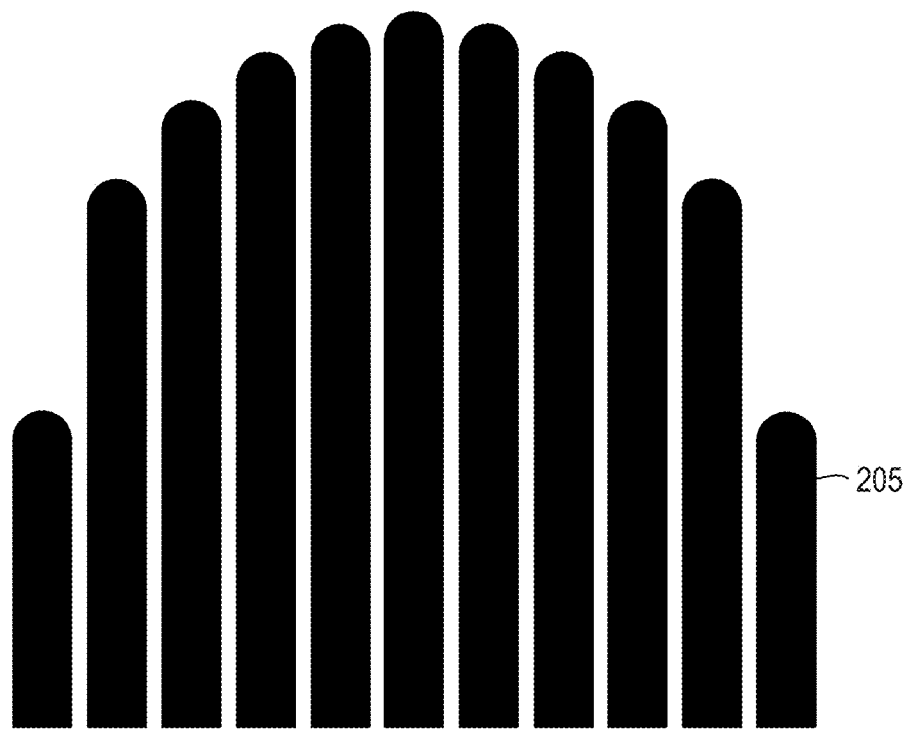
FIG. 7 is a schematic diagram illustrating a portion of the NMR probe coil of FIG. 1 in accordance with a representative embodiment.

FIG. 7 is a schematic diagram illustrating another example of portion 210 of NMR probe coil 100. A grid is provided in FIG. 7 to illustrate the scale of NMR probe coil 100, with each square of the grid corresponding to 2 µm. In the example of FIG. 7, each of fingerlets 205 is about 11 µm wide, and the slits are about 2.5 µm wide.

Figure 8:
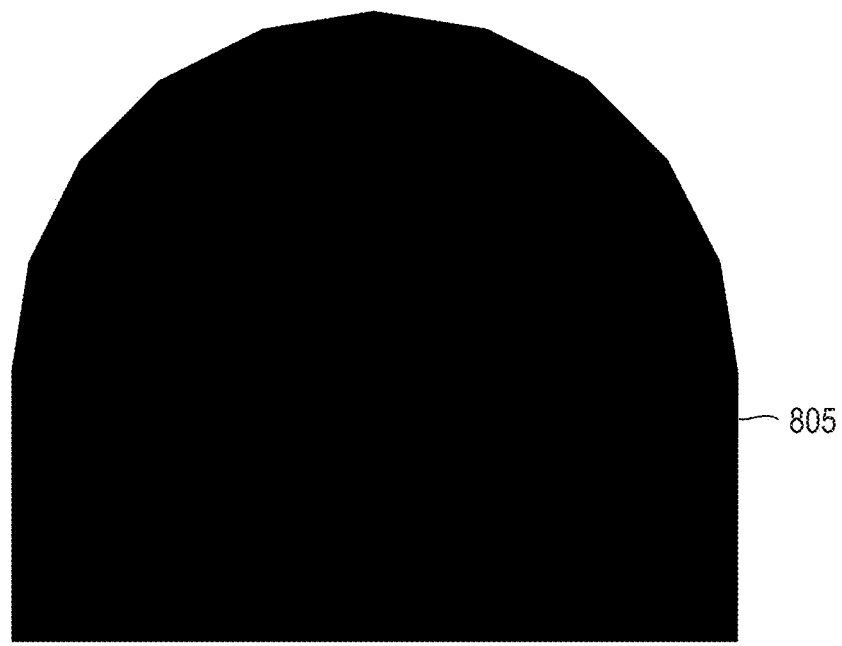
FIG. 8 is a schematic diagram illustrating the portion shown in FIG. 7 after it is covered with a normal-metal overlayer in accordance with a representative embodiment.

FIG. 8 is a schematic diagram illustrating the portion 210 shown in FIG. 7 after it has been covered with a normal-metal overlayer 805 in accordance with a representative embodiment. Normal-metal overlayer 805 comprises a metal such as gold, which is deposited over spiral 105 including fingerlets 205 and then patterned to the shape of spiral 105.

Figure 9:
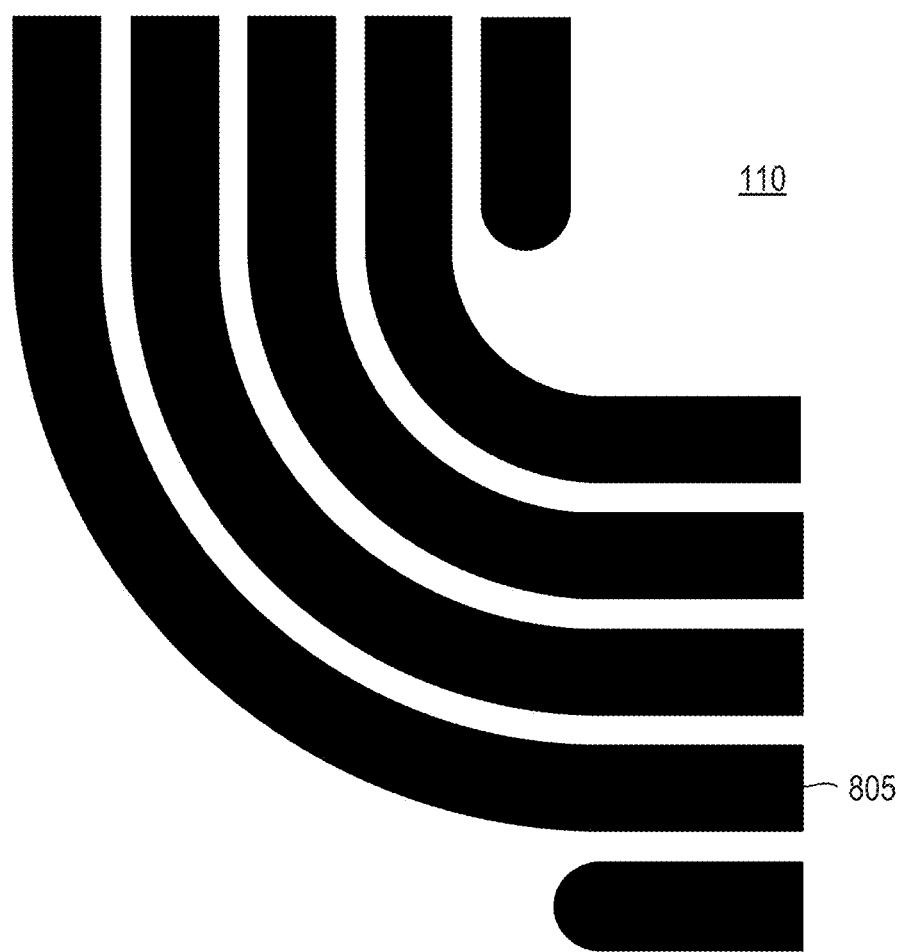
FIG. 9 is a schematic diagram illustrating the portion shown in FIG. 2 after it is covered with a normal-metal overlayer in accordance with a representative embodiment.

FIG. 9 is a schematic diagram illustrating the portion 110 of FIG. 2 after it is covered with normal-metal overlayer 805 in accordance with a representative embodiment. As illustrated in FIG. 9, normal-metal overlayer 805 spans the width of each turn of spiral 105 to suppress spurious modes and arcing.

Figure 10:
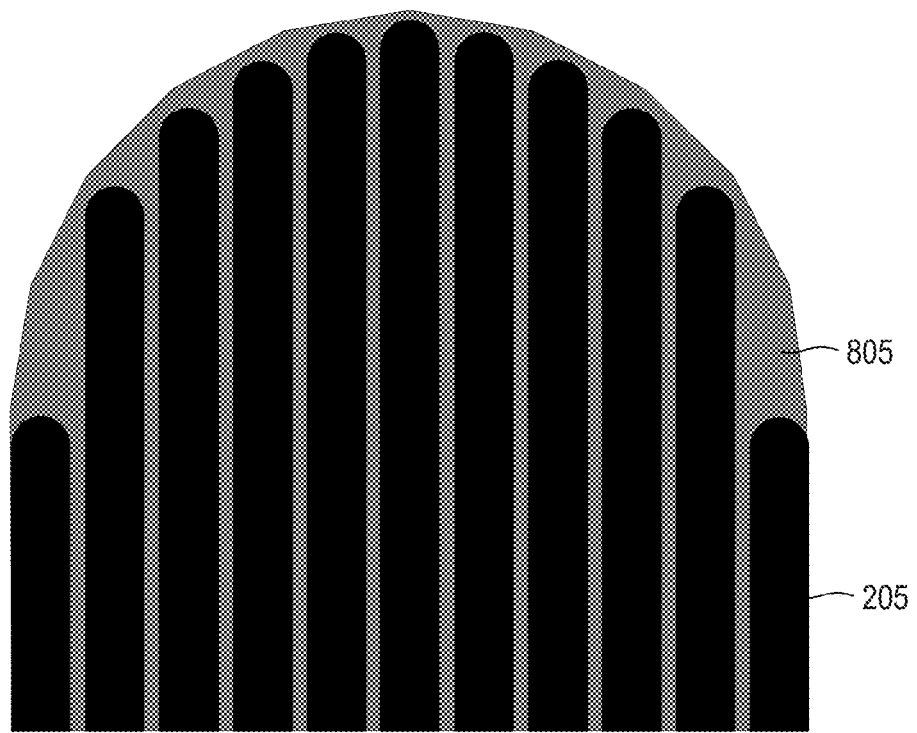
FIG. 10 is a schematic diagram illustrating a configuration of a normal-metal overlayer covering the portion illustrated in FIG. 7 in accordance with a representative embodiment.

FIG. 10 is a schematic diagram illustrating a configuration of normal-metal overlayer 805 in portion 210 of FIG. 7 in accordance with a representative embodiment. In FIG. 10, normal-metal overlayer 805 is shown in relation to fingerlets 205. In particular, normal-metal overlayer 805 is shown with outer edges that are substantially aligned with outer edges of fingerlets 205.

In the foregoing and other embodiments, electrical losses can occur in the NMR probe coils for a variety of reasons. These electrical losses can add resistance to the coils, which tends to increase electrical noise and reduce sensitivity. Moreover, the use of the normal-metal overlayer, in particular, can contribute to electrical losses and noise in several ways. The following four loss mechanisms are particularly relevant to the design of certain embodiments including an unslit normal-metal overlayer.

A first loss mechanism is an increased surface resistance of the superconductor that results from the unslit normal-metal overlayer. The increased surface resistance is independent of how the overlayer is patterned. In addition, it is proportional to the thickness and conductivity of the overlayer such that a thin and poorly conducting overlayer adds less loss than a thicker and more conductive overlayer.

A second loss mechanism is a misalignment between the unslit overlayer pattern and the HTS pattern due to gold extending beyond the edge of the HTS fingers. This loss occurs because RF currents tend to crowd near the edges of the fingers. This loss also increases with increasing overlayer thickness and conductivity.

A third loss mechanism includes electrical potential differences between the several fingerlets that make up a finger. These potential differences are generally small compared to the potential difference between neighboring fingers, but they are not necessarily zero. These potential differences can drive a current flow through the normal-metal overlayer in the gaplets between the fingerlets to cause electrical loss. Unlike the first and second loss mechanisms, these losses tend to decrease with increasing normal-metal thickness and conductivity.

A fourth loss mechanism results from the contact resistance between the unslit normal metal and the normal metal that was patterned with the HTS film.

Figure 11:
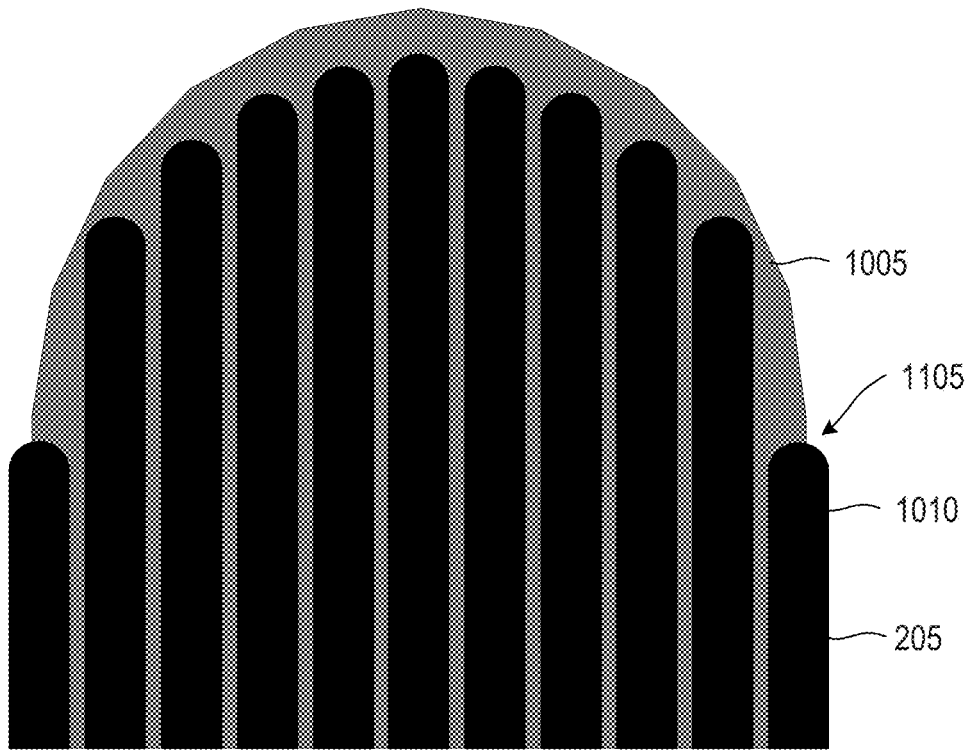
FIG. 11 is a schematic diagram illustrating a configuration of a normal-metal overlayer covering the portion illustrated in FIG. 7 in accordance with a representative embodiment.

FIG. 11 is a schematic diagram illustrating another configuration of normal-metal overlayer 805 in portion 210 of FIG. 7 in accordance with a representative embodiment. In FIG. 11, normal-metal overlayer 805 is shown with outer edges that are receded by about 3 µm from the outer edges of fingerlets 205. By addressing the second loss mechanism mentioned above, this receding of normal-metal overlayer 805 can improve the Q-value of NMR probe coil 100.

Figure 12:
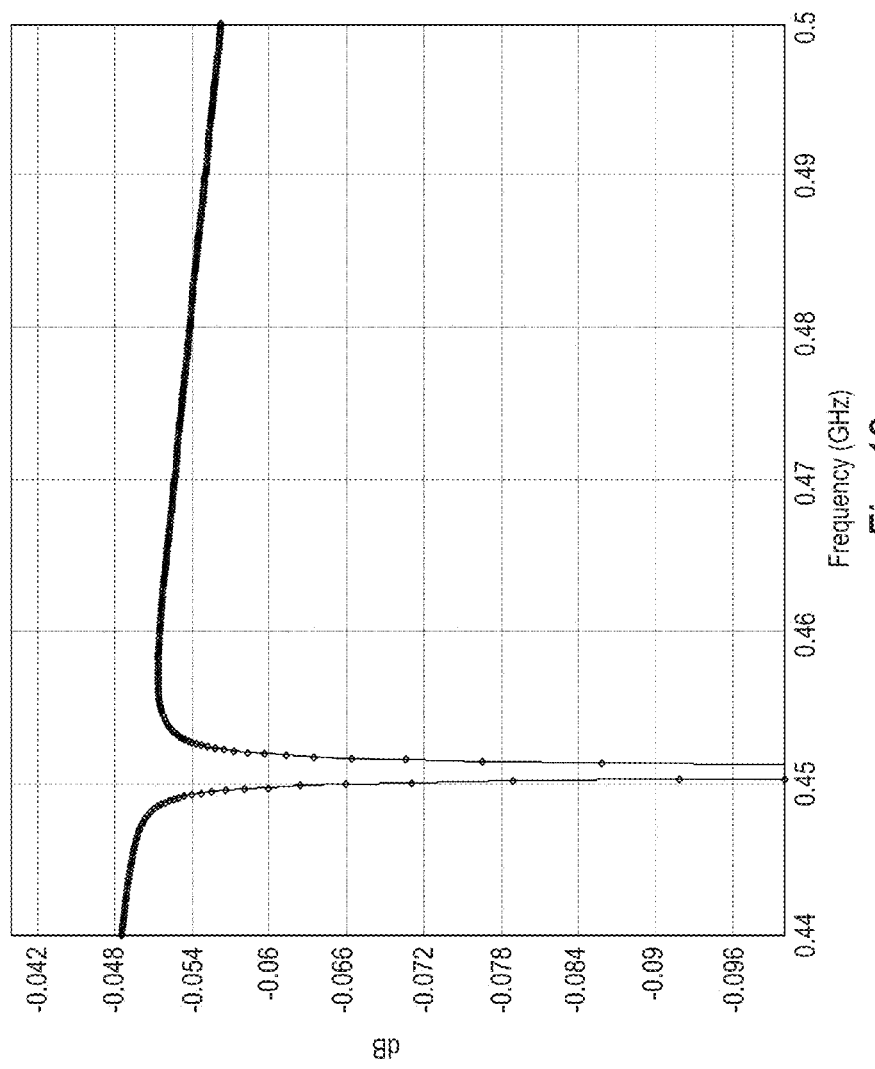
FIG. 12 is a graph illustrating a spurious resonance mode in the NMR probe coil of FIG. 1 in accordance with a representative embodiment.
Figure 13A:
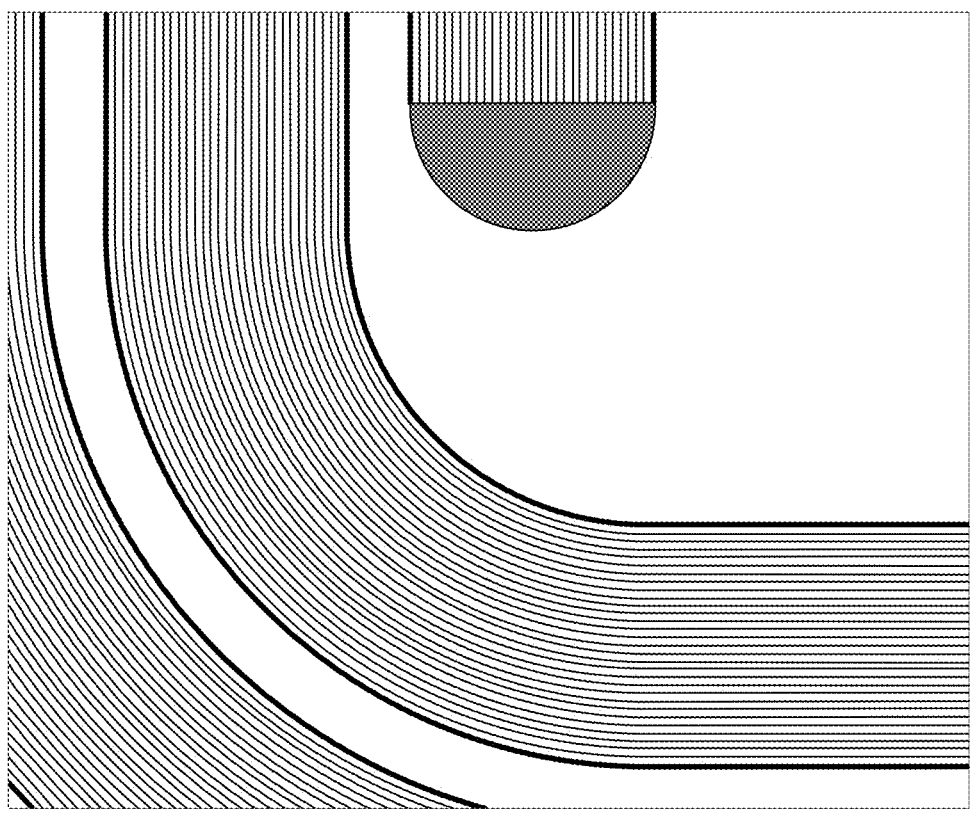
FIGS. 13A through 13D illustrate an NMR probe coil in accordance with another representative embodiment.
Figure 13B:
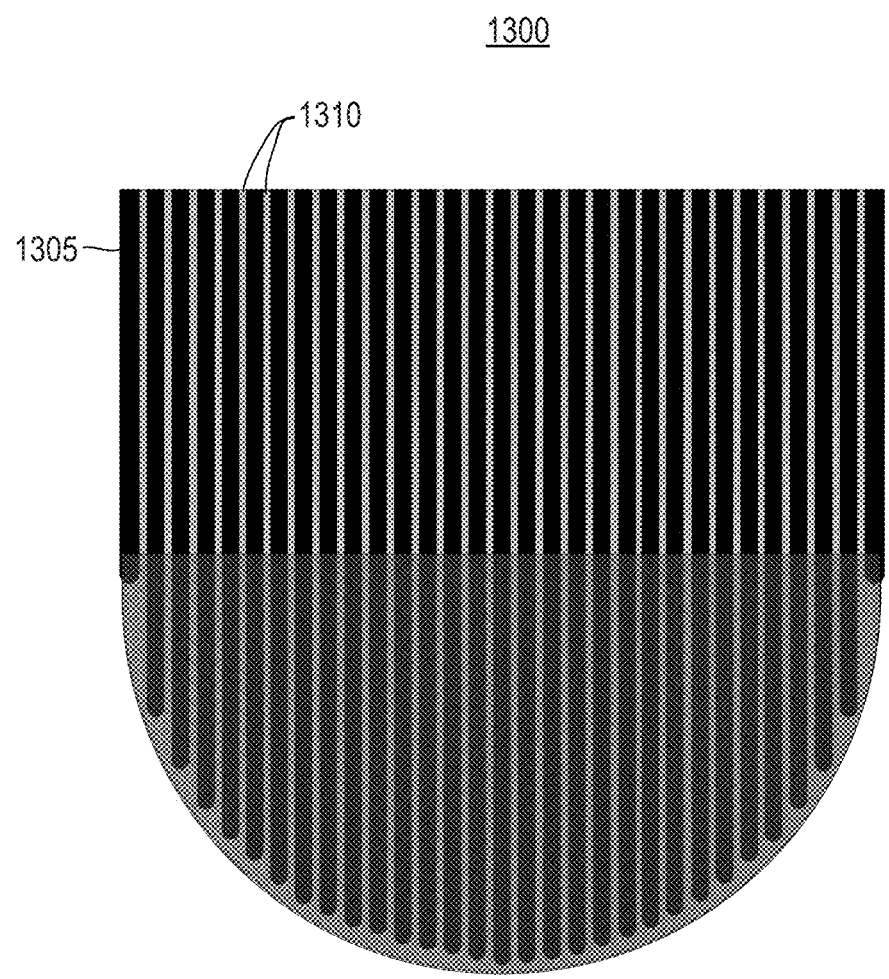
Figure 13C:
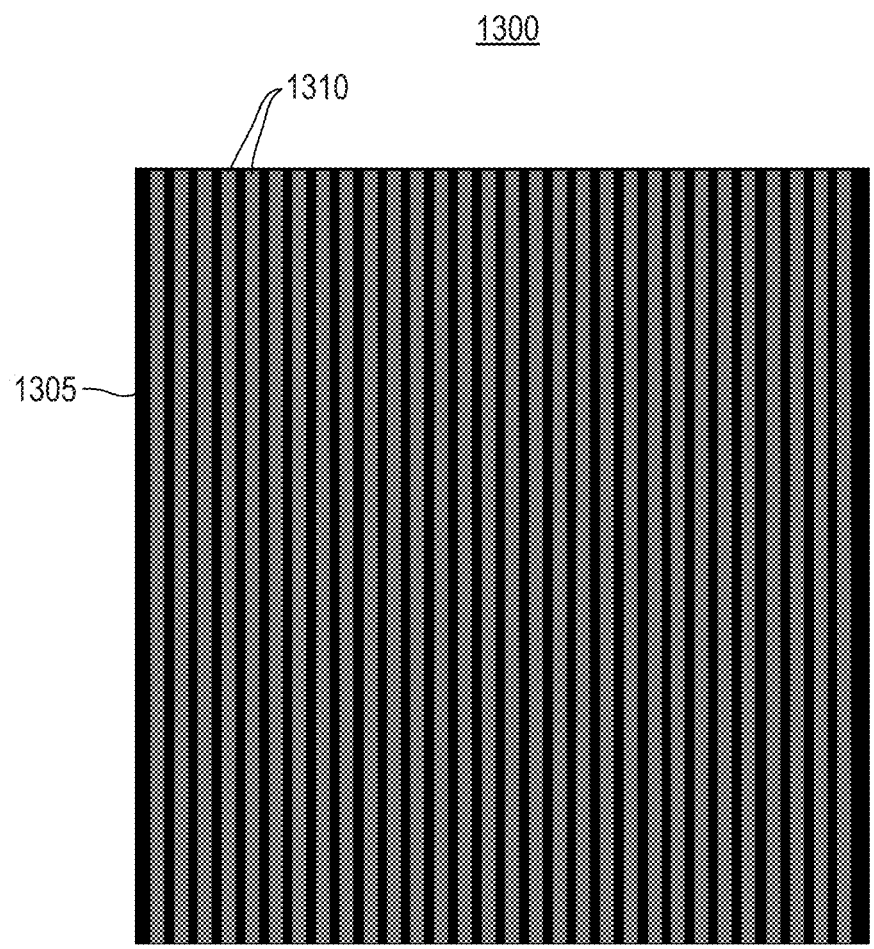
Figure 13D:
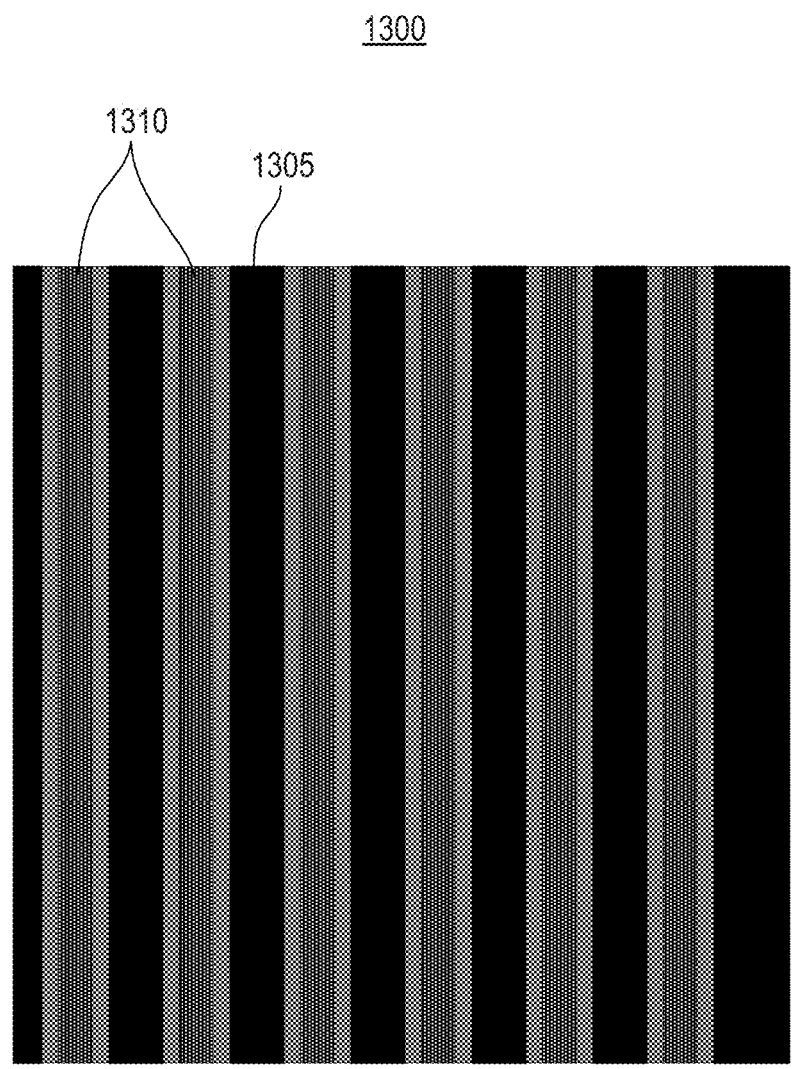
Figure 14B:
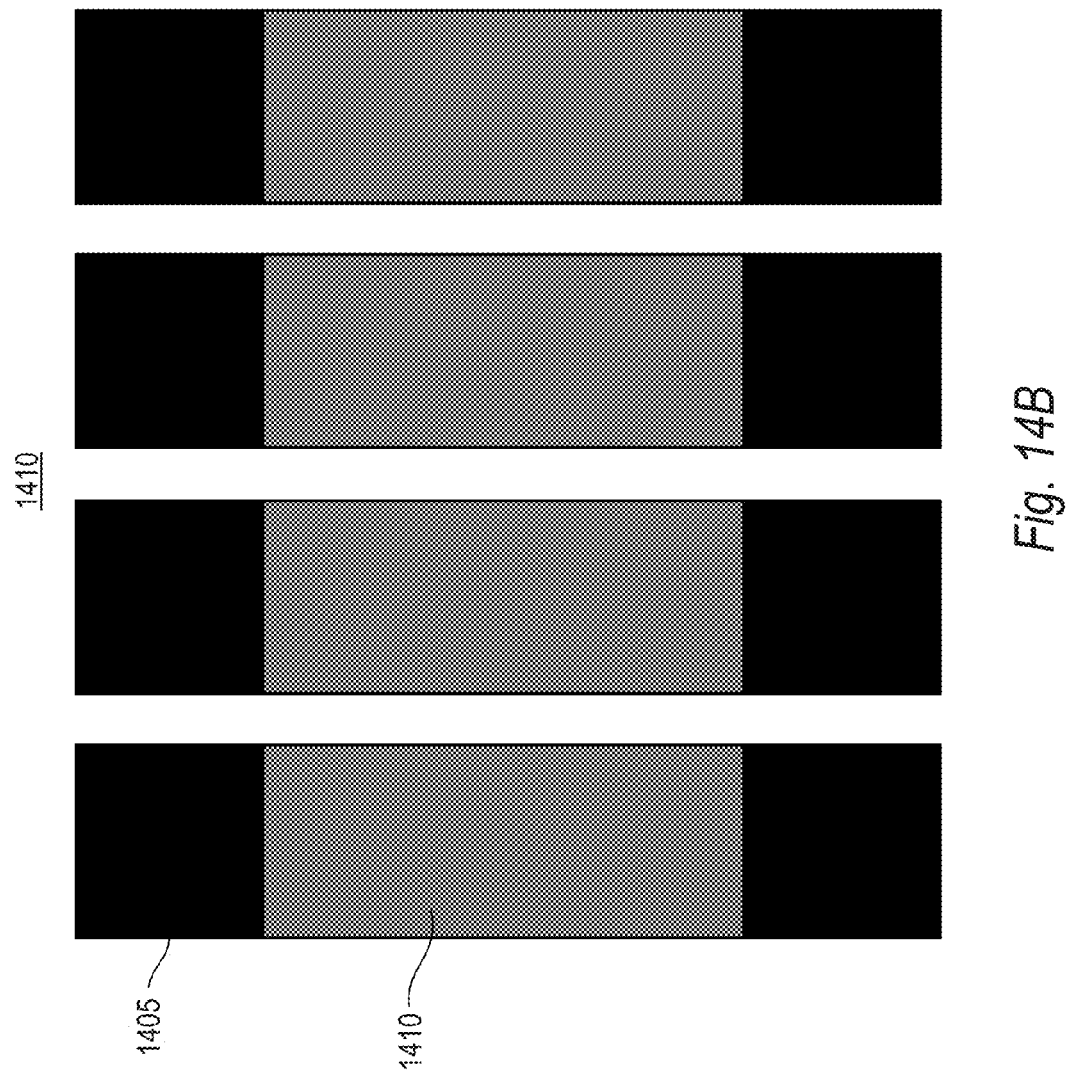
Figure 14D:
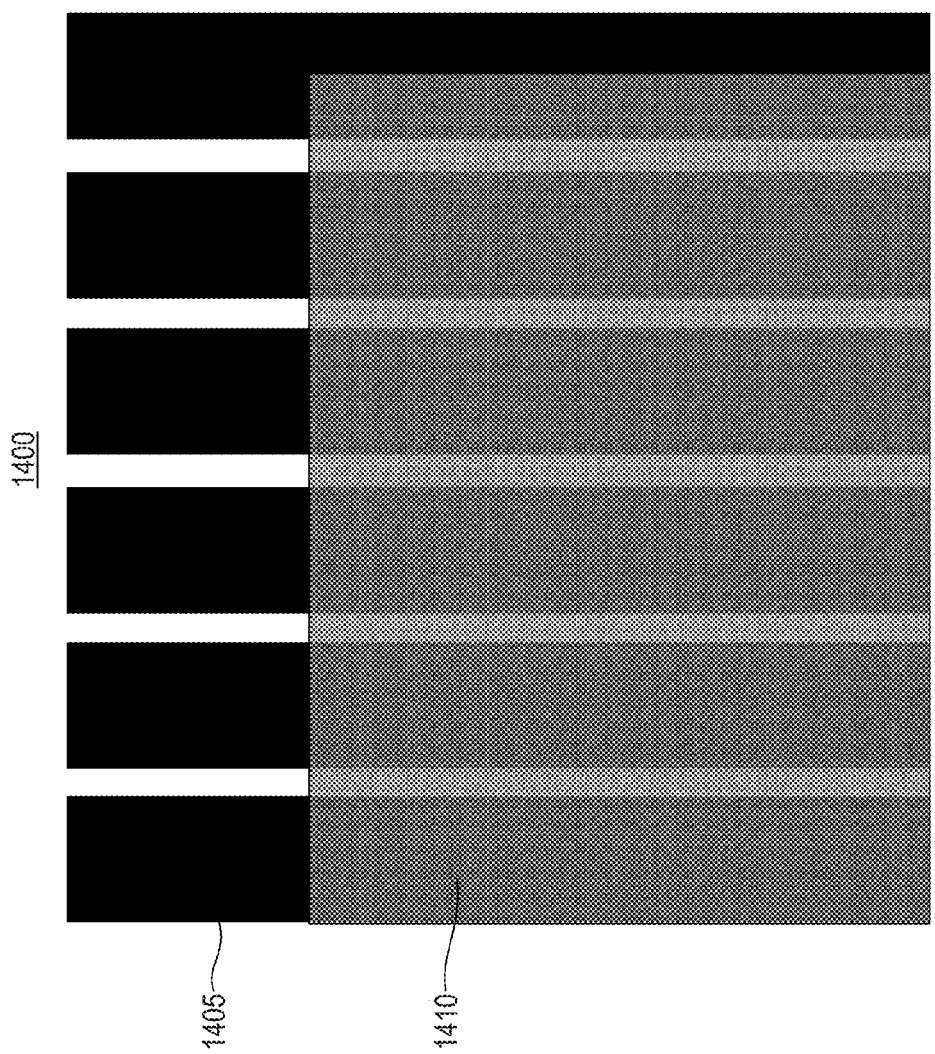

FIG. 12 is a graph illustrating a spurious resonance mode of NMR probe coil 100 having a normal-metal overlayer 805 in accordance with a representative embodiment, as predicted by an electromagnetic modeling program. The graph of FIG. 12 can be compared with the graph of FIG. 4, which corresponds to a spiral without the normal-metal overlayer 805. As indicated by FIG. 12, the addition of normal-metal overlayer 805 eliminates the spurious modes attributable to the slits between fingerlets 205. Accordingly, only one of the ten spurious modes shown in FIG. 4 is present in FIG. 12.

In experimental examples of NMR probe coil 100 using YBCO as the HTS material and gold as normal-metal overlayer 805, the following Q-values were obtained. A set of eight NMR probe coils in the configuration of FIG. 2 without normal-metal overlayer 805 had average measured matched Q-values of 11500. A set of two coils having the configuration of FIG. 10, with gold overcoating aligned to the edges of fingerlets 205, had average Q-values of 4400. The single coil with the receded gold spiral had a matched Q-value of 5890, and the one with the gold spiral expanded had a matched Q-value of 1860. These Q-values are merely examples, and the above Q-values can be improved in a number of ways, such as reducing or increasing the thickness of the gold overcoat. Because one of the loss mechanisms associated with the normal-metal overcoat varies as the inverse of the overlayer thickness and two mechanisms vary in proportion to its thickness, there is an optimum thickness that yields a maximum Q-value.

FIGS. 13A through 13D illustrate an NMR probe coil 1300 according to another representative embodiment. In FIGS. 13A through 13D, the NMR probe coil 1300 is shown with increasing levels of magnification.

Similar to other NMR probe coils described above, NMR probe coil 1300 comprises an HTS film 1305 coated by an unslit overlayer 1310. However, NMR probe coil 1300 reduces the area of HTS film 1305 that is coated by unslit overlayer 1310 by forming unslit overlayer 1310 only between gaps in the HTS film. In other words, unslit overlayer 1310 is formed primarily in the gaplets and covers HTS film 1305 only along the HTS fingerlets' edges in order to make ohmic contact. This prevents the overcoat from increasing the surface resistance of the HTS film in the center of the fingerlets.

FIGS. 14A through 14D illustrate an NMR probe coil 1400 according to another representative embodiment. In FIGS. 14A through 14D, the NMR probe coil 1400 is shown with increasing levels of magnification.

Similar to other NMR probe coils described above, NMR probe coil 1400 comprises an HTS film 1405 coated by an unslit overlayer 1410. However, in NMR probe coil 1400, unslit overlayer 1410 covers HTS film 1405 only in 6 independent regions, or "patches", distributed around the spiral. This increases the surface resistance in just these few patches. However, it can increase electrical losses from the third mechanism described above.

In certain embodiments, an NMR probe coil is formed in a counterwound pair of spirals. In such embodiments, a slit HTS spiral having the normal-metal overlayer is used in combination with a slit HTS spiral without the normal-metal overlayer. This combination of coils can benefit from the improved Q-value of the coil without the normal-metal overlayer, while also benefiting from the reduction of spurious modes of the other coil. The groups of spurious modes in the coil without the normal-metal overlayer can be substantially decoupled from the coil with the normal-metal overlayer, improving the performance of the counterwound pair.

Figure 15:
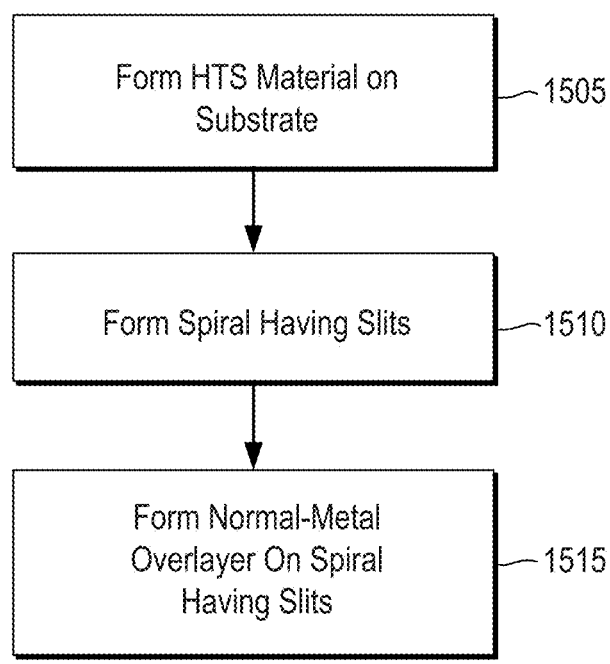
FIG. 15 is a flowchart illustrating a method of forming an NMR probe coil in accordance with a representative embodiment.

FIG. 15 is a flowchart illustrating a method 1500 for forming an NMR probe coil in accordance with a representative embodiment. In the description that follows, example method steps are indicated by parentheses.

Referring to FIG. 15, the method begins by forming a film of HTS material on a dielectric substrate (1505). The dielectric substrate typically comprises sapphire, and it can be provided in the form of a wafer suitable for manufacturing multiple probe coils. In one embodiment, the HTS material is formed by inserting the substrate in a co-evaporation chamber and simultaneously evaporating yttrium, barium, and copper to form an initial layer on the substrate. The substrate is then placed in an oxygen atmosphere to oxidize the initial layer. The substrate has a lattice match to YBCO, which allows the deposited elements to grow epitaxially. In certain embodiments, the YBCO is grown to a thickness of about 0.3 µm. After the YBCO is grown on the substrate, a flash of gold can be formed on top of the YBCO to protect it against so-called "RF quench" and environmental contamination or degradation.

Next, the method forms a spiral with slits along the length of the spiral (1510). This can be accomplished, for example, by a photolithographic process. In the photolithographic process, a photomask is formed to define a spiral having a plurality of fingerlets such as those shown in FIG. 2, for example. The photomask can be formed, for instance, by depositing chromium on glass. Next, photoresist is spun on the HTS material, and the photoresist is exposed using the photomask. Following the exposure, the photoresist is partially removed so that it covers only portions of the HTS material that correspond to the fingerlets. Then, the HTS material is etched to remove portions that are not covered by the photoresist. This etching can be accomplished, for instance, using an ion mill with argon ions.

Finally, the method forms a normal-metal overlayer on the spiral having the slits (1515). This can be accomplished, for instance, by depositing gold or another normal-metal over the spiral and then patterning the normal-metal according to the shape of the spiral, as illustrated, for instance, in FIGS. 10 and 11.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A nuclear magnetic resonance (NMR) probe coil, comprising:
    a superconducting material formed in a spiral having a plurality of fingerlets separated by a plurality of slits; and
    a normal-metal overlayer formed on the spiral over the plurality of fingerlets and the plurality of slits.

2. The NMR probe coil of claim 1, wherein the superconducting material comprises yttrium barium copper oxide.

3. The NMR probe coil of claim 1, wherein the normal-metal layer is formed of gold.

4. The NMR probe coil of claim 1, wherein the superconducting material is formed on a planar substrate comprising synthetic sapphire.

5. The NMR probe coil of claim 1, further comprising a second NMR probe coil formed in a back-to-back configuration and in counterwound direction relative to the NMR probe coil.

6. The NMR probe coil of claim 5, wherein the second NMR probe coil comprises a superconducting material without a normal-metal overlayer.

7. The NMR probe coil of claim 1, wherein each of the fingerlets has a width of about 10 µm or less, and each of the slits has a width of about 3 µm or less.

8. The NMR probe coil of claim 1, wherein the normal-metal overlayer has a thickness of about 300 nm or less.

9. The NMR probe coil of claim 1, wherein the normal-metal overlayer is receded inward from a pair of outermost fingerlets of the spiral.

10. The NMR probe coil of claim 9, wherein the normal-metal overlayer is receded inward by a distance of about one third of the width of the outermost fingerlets or less.

11. The NMR probe coil of claim 1, wherein the fingerlets have semicircular ends.

12. The NMR probe coil of claim 1, wherein the normal-metal overlayer is formed over the superconducting material in a plurality of patches.

13. The NMR probe coil of claim 1, wherein the normal-metal overlayer is formed in strips filling gaplets between the fingerlets of the superconducting material.

14. A nuclear magnetic resonance (NMR) probe, comprising:
    a probe coil comprising a superconducting material formed in a spiral having a plurality of fingerlets separated by a plurality of slits, and a normal-metal overlayer formed on the spiral over the plurality of fingerlets and the plurality of slits; and
    a heat exchanger configured to cryogenically cool the superconducting material.

15. The NMR probe of claim 14, wherein the superconducting material comprises yttrium barium copper oxide (YBCO), and the heat exchanger is configured to cool the YBCO to 20 Kelvin or below.

16. The NMR probe of claim 14, further comprising a sample region configured to maintain a sample at a distance from the probe coil of approximately 2 mm or less during an NMR measurement.

17. A method of forming a nuclear magnetic resonance (NMR) probe coil, the method comprising:
    forming a high temperature superconducting (HTS) film on substrate;
    forming the HTS film into a spiral comprising a plurality of fingerlets separated by a plurality of slits; and;
    forming a normal-metal overlayer over the plurality of fingerlets and the plurality of slits.

18. The method of claim 17, wherein forming the normal-metal overlayer over the plurality of fingerlets and the plurality of slits comprises depositing a gold layer over the spiral and patterning the gold layer according to the shape of the spiral.

19. The method of claim 18, further comprising:
    removing portions of the gold layer at outer edges of outermost fingerlets such that a portion of the outer edges are exposed through the gold layer.

20. The method of claim 17, wherein each of the fingerlets has a width of about 10 µm or less, and each of the slits has a width of about 3 µm or less.

* * * * *